United States Patent
Uchida et al.

(10) Patent No.: US 9,142,424 B2
(45) Date of Patent: Sep. 22, 2015

(54) CLEANING SYSTEM AND CLEANING METHOD

(75) Inventors: Minoru Uchida, Tokyo (JP); Toru Otsu, Tokyo (JP)

(73) Assignee: KURITA WATER INDUSTRIES LTD. (JP)

( * ) Notice: Subject to any disclaimer, the term of this patent is extended or adjusted under 35 U.S.C. 154(b) by 172 days.

(21) Appl. No.: 13/575,042

(22) PCT Filed: May 26, 2011

(86) PCT No.: PCT/JP2011/062058
§ 371 (c)(1),
(2), (4) Date: Jul. 25, 2012

(87) PCT Pub. No.: WO2011/155335
PCT Pub. Date: Dec. 15, 2011

(65) Prior Publication Data
US 2012/0291806 A1  Nov. 22, 2012

(30) Foreign Application Priority Data
Jun. 7, 2010  (JP) ................. 2010-130560

(51) Int. Cl.
*B08B 3/00* (2006.01)
*H01L 21/311* (2006.01)
*C25B 1/28* (2006.01)
(Continued)

(52) U.S. Cl.
CPC .......... *H01L 21/31133* (2013.01); *C25B 1/285* (2013.01); *C25B 9/08* (2013.01); *H01L 21/67017* (2013.01)

(58) Field of Classification Search
CPC ............. H01L 21/31133; H01L 21/67017
USPC .................................. 134/105, 108, 902
See application file for complete search history.

(56) References Cited

U.S. PATENT DOCUMENTS 5,058,491 A * 10/1991 Wiemer et al. ............. 454/187
2006/0081180 A1   4/2006 Aoki et al.
(Continued)

FOREIGN PATENT DOCUMENTS

JP   2006-108304 A1   4/2006
JP   2007-266495 A1   10/2007
(Continued)

OTHER PUBLICATIONS

Machine Translation of Uchida et al, JP 2010060147 A, Mar. 2010.*

*Primary Examiner* — David Cormier
(74) *Attorney, Agent, or Firm* — Baker Hostetler LLP

(57) ABSTRACT

Provided are a system and method capable of providing a sulfuric acid solution containing peroxosulfuric acid for use in cleaning even in an installation-limited space such as a clean room while suppressing the fluid pressure in a heating part such as a rapid heating heater.

The system comprises: an electrolytic part for electrolyzing a sulfuric acid solution to produce peroxosulfuric acid; a first reservoir for storing the sulfuric acid solution; a circulation line for circulating the sulfuric acid solution between the electrolytic part and the first reservoir; a cleaning apparatus for cleaning a cleaning object by use of the sulfuric acid solution containing peroxosulfuric acid; a supply line for sending the sulfuric acid solution electrolyzed in the electrolytic part to the cleaning apparatus; a heating part for heating the sulfuric acid solution to be used in the cleaning apparatus, the heating part being interposed in the supply line on the upstream side of the cleaning apparatus; and a second reservoir which is interposed in the supply line on the upstream side of the heating part. Since the second reservoir and the heating parts are positioned spatially above the level of the first reservoir, the electrolytic part and the circulation line, the device can be disposed with good space efficiency while preventing application of a high fluid pressure to the heating part or the like.

13 Claims, 1 Drawing Sheet

(51) Int. Cl.
 *C25B 9/08* (2006.01)
 *H01L 21/67* (2006.01)

(56) References Cited

U.S. PATENT DOCUMENTS

2008/0110766 A1* 5/2008 Hayamizu et al. ............ 205/472
2009/0078582 A1* 3/2009 Kobayashi et al. ........... 205/554

FOREIGN PATENT DOCUMENTS

| | | |
|---|---|---|
| JP | 2010-60147 A1 | 3/2010 |
| JP | 2010060147 A * | 3/2010 |
| TW | 200507979 | 3/2005 |
| TW | 200831712 | 8/2008 |
| TW | 201015032 | 8/2009 |
| WO | WO 2010/023959 A1 | 3/2010 |

* cited by examiner

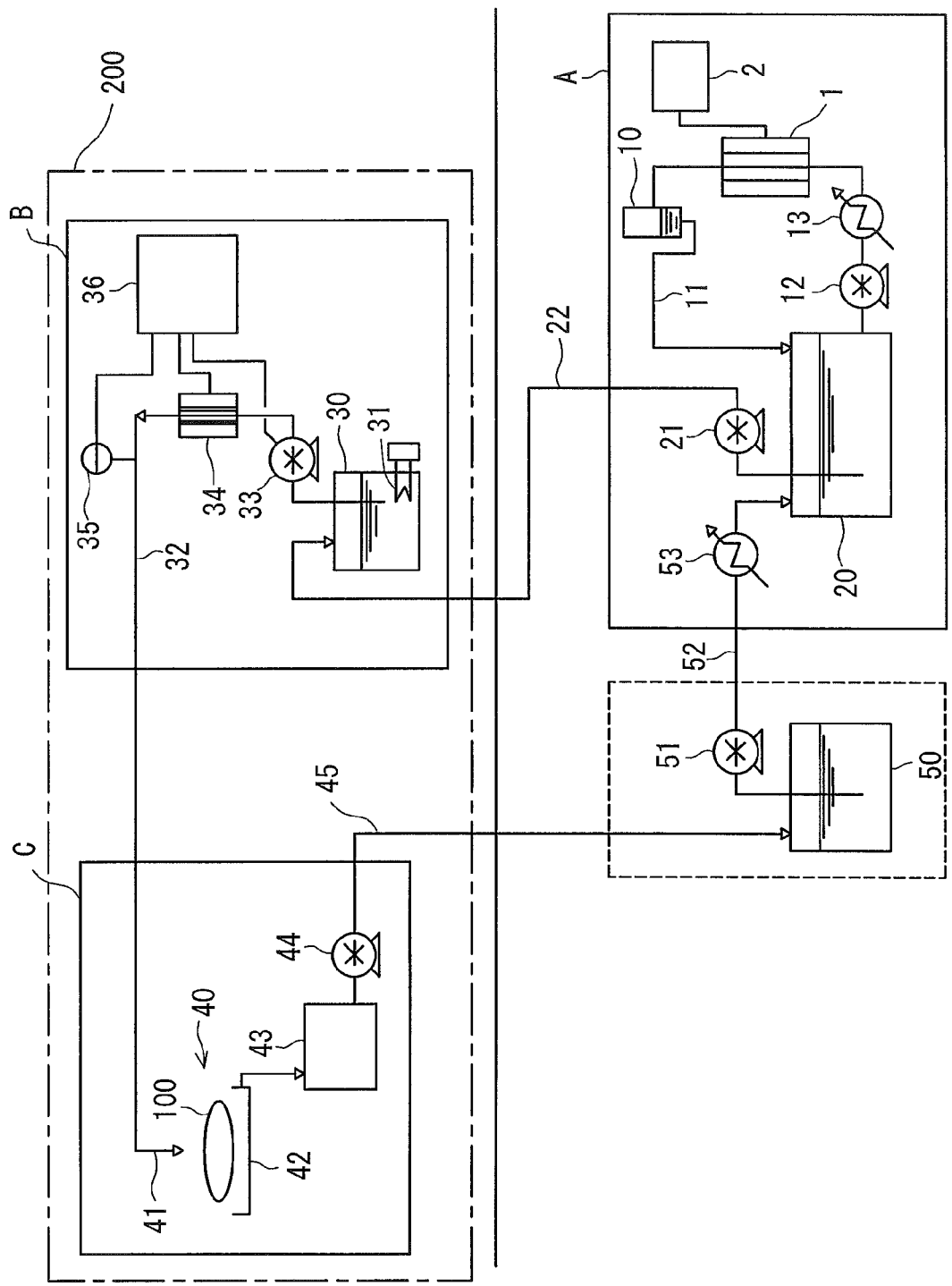

CLEANING SYSTEM AND CLEANING METHOD

TECHNICAL FIELD

The present invention relates to a cleaning system and a cleaning method, which can be suitably used for cleaning of a resist adhered to an electronic material such as a silicon wafer by supplying a sulfuric acid solution containing peroxosulfuric acid, which is obtained by electrolyzing a sulfuric acid solution, to a cleaning apparatus for performing the cleaning of the resist or the like.

BACKGROUND ART

In a resist stripping step in semiconductor manufacturing, a sulfuric acid electrolytic method is known, in which cleaning is performed using a peroxosulfuric acid solution as cleaning liquid by electrolyzing a sulfuric acid solution to produce peroxosulfuric acid (peroxodisulfuric acid and peroxomonosulfuric acid; molecular peroxosulfuric acid and ionic peroxosulfuric acid). In the resist stripping step, the resist stripping is promoted more efficiently as the temperature of the cleaning liquid is higher. This is considered to be attributable to that when the cleaning liquid produced by the sulfuric acid electrolytic method reaches a predetermined high temperature, the peroxosulfuric acid in the cleaning liquid self-decomposes to generate a sulfuric radical with extremely high oxidative power, contributing to the cleaning.

However, since the radical has a short life-span, the cleaning liquid is consumed without contributing to the cleaning, when the temperature of the cleaning liquid is raised in an early stage, due to premature self-decomposition of the peroxosulfuric acid contained in the cleaning liquid. When the cleaning liquid is heated slowly over a long time (e.g., about several minutes), a problem in which the concentration of peroxosulfuric acid has been reduced at the moment the cleaning liquid reaches the high temperature arises since the self-decomposition of the peroxosulfuric acid and decomposition of the sulfuric radial associated therewith progress in the middle of heating.

The cleaning of an electronic material substrate or the like is performed by a single-wafer type as well as a batch type. In the single-wafer type, for example, a cleaning object is fixed to a rotary table, and cleaned by means of spraying of a chemical, flushing with the chemical, or the like while rotating the table. In a single-wafer cleaning apparatus, the cleanliness of the electronic material substrate such as a wafer can be kept high, compared with batch type cleaning. Further, an unnecessary resist can be efficiently stripped from an electronic material such as a silicon wafer with relatively little usage of the chemical. However, the chemical to be used in the single-wafer cleaning apparatus is required to have characteristics conditioned more stringently than those of an electrolytic sulfuric acid solution to be used in a batch type cleaning apparatus. In stripping of a resist which is ion-implanted at a high concentration of $1 \times 10^{15}$ atoms/cm$^2$ or more, particularly, a cleaning liquid having a further high peroxosulfuric acid concentration and a further high liquid temperature is needed.

In the above-mentioned viewpoint, the present inventors proposed a cleaning system provided with a rapid heating heater (refer to Patent Literature 1) in consideration of the need to perform the temperature rise of cleaning liquid in a given short time just before cleaning. In this cleaning system, a storage tank storing an electrolyte is connected to the rapid heating heater through a supply line, and the outlet side of the rapid heating heater is further joined to a supply line to a cleaning apparatus by a flange or the like. A sulfuric acid solution is sent from the storage tank to the rapid heating heater by a pump, heated by the rapid heating heater, and supplied to the cleaning apparatus as it is at the pressure at the time of solution sending.

CITATION LIST

Patent Literature

Patent Literature 1; Japanese Patent Application Laid-Open No. 2010-60147

SUMMARY OF INVENTION

Technical Problem

However, quartz which is glassy and brittle or the like is often used for a flow passage of the above-mentioned rapid heating heater, and an increased feeding pressure can cause breakage of the rapid heating heater.

Further, although the cleaning of the electronic material substrate is generally performed in a clean room, the cleaning system cannot be freely installed due to many restrictions on installation since the installation space in the clean room is limited, and it is difficult to install the cleaning system in consideration of the feeding pressure.

The present invention is achieved with the above-mentioned conditions as a background, and has an object to provide a cleaning system and a cleaning method, which facilitate the installation in a clean room with a limited installation space or the like while minimizing the feeding pressure for rapid heating.

Solution to Problem

Namely, the cleaning system of the present invention includes; an electrolytic part for electrolyzing a sulfuric acid solution to produce peroxosulfuric acid; a first reservoir for storing the electrolyzed sulfuric acid solution; a circulation line for circulating the sulfuric acid solution between the electrolytic part and the first reservoir; a cleaning apparatus for cleaning a cleaning object by use of the sulfuric acid solution containing peroxosulfuric acid; a supply line for sending the sulfuric acid solution electrolyzed in the electrolytic part to the cleaning apparatus; a heating part for heating the sulfuric acid solution to be used in the cleaning apparatus, the heating part being interposed in the supply line on the upstream side of the cleaning apparatus; and a second reservoir which is interposed in the supply line on the upstream side of the heating part, wherein the second reservoir and the heating part are positioned spatially above the level of the first reservoir, the electrolytic part and the circulation line.

The cleaning method of the present invention for cleaning a cleaning object with a sulfuric acid solution containing peroxosulfuric acid comprises: circulating a sulfuric acid solution while electrolyzing it in an electrolytic part; extracting a part of the circulating sulfuric acid solution; storing the extracted circulating sulfuric acid solution at a position spatially above the level where the circulation is performed; and then rapidly heating the stored sulfuric acid solution to be served for the cleaning.

In the present invention, the sulfuric acid solution is circulated between the electrolytic part and the first reservoir by the circulation line, whereby the peroxosulfuric acid can be continuously produced by electrolysis.

In the supply line, the circulating sulfuric acid solution which has been electrolyzed is extracted. The extraction position can be set to any one of the delivery side of the electrolytic part, the circulation line, and the first reservoir.

The sulfuric acid solution sent through the supply line is temporarily stored in the second reservoir, and then sent to the heating part. Therefore, the feeding pressure on the upstream side of the second reservoir is never transmitted to the downstream side as it is. Since the second reservoir and the heating part are positioned above the level where the circulation is performed, the sulfuric acid solution can be sent to the cleaning apparatus through the heating part at a further small feeding pressure on and after the second reservoir.

In the electrolytic part, the peroxosulfuric acid which enhances the cleaning effect is produced by electrolyzing the sulfuric acid solution as described above. In this electrolysis, the lower the solution temperature is, the higher the production efficiency of peroxosulfuric acid is. Therefore, the electrolysis temperature in the production of peroxosulfuric acid is preferably set to 80° C. or lower. A temperature exceeding this temperature range causes noticeable deterioration of electrolytic efficiency. On the other hand, an excessively low temperature causes serious wear of electrodes. Therefore, the above-mentioned temperature is preferably set to 40° C. or higher.

In the above-mentioned electrolytic part, the electrolysis is performed with an anode and a cathode being paired. The materials of these electrodes are never limited to specific ones in the present invention. However, when platinum which is widely used as electrodes is used as the anode of the electrolytic part in the present invention, there are problems that the peroxosulfuric acid cannot be efficiently produced and platinum is eluted. In contrast, a conductive diamond electrode allows efficient production of peroxosulfuric acid with minimized wear of the electrode. Therefore, it is preferred that at least the anode at which the peroxosulfuric acid is produced, of the electrodes in the electrolytic part, is constituted by the conductive diamond electrode, and it is further preferred that both the anode and the cathode are constituted by the conductive diamond electrode. As the conductive diamond electrode, a conductive diamond thin film synthesized on a surface of a semiconductor material such as a silicon wafer as a substrate, or self-stand conductive polycrystalline diamond precipitated and synthesized thereon in a plate-like shape can be adopted. A diamond thin film laminated on a metal substrate such as Nb, W, or Ti can be also used. The conductive diamond thin film is obtained by giving conductivity to a diamond thin film by doping with a predetermined amount of boron or nitrogen in the synthesis of the diamond thin film, and the diamond thin film is generally doped with boron. The doping amount is suitably in the range of 50 to 20,000 ppm relative to the amount of carbon in the diamond thin film since an excessively small amount cannot develop a technical value, and an excessively large amount saturates the doping effect.

The temperature of the sulfuric acid solution in the first reservoir is preferably set to 50 to 90° C. (particularly, 60 to 70° C.). If the temperature is high, the sulfuric acid solution in the first reservoir to be sent to the electrolytic part must be cooled in preparation for electrolysis, resulting in an increased cooling load. Therefore, the temperature is preferably 90° C. or lower. Further, since a excessively lower temperature can cause wear of the electrodes in the electrolytic part, the temperature of the sulfuric acid solution in the reservoir for electrolysis solution is preferably 50° C. or higher.

In the second reservoir, it is preferred to store the sulfuric acid solution which has been preheated. The preheating may be performed in the supply line or may be performed in the second reservoir. The preheating further facilitates the rapid heating with minimized heating load in the heating part on the downstream side. The temperature of the preheating is preferably set within the range of 90 to 120° C. At a temperature below 90° C., the effect of reducing the heating load in the heating part is insufficient. At a temperature exceeding 120° C., sufficient oxidation performance cannot be secured in the cleaning since the self-decomposition of peroxosulfuric acid is promoted.

In the heating part, the sulfuric acid solution is preferably heated so that the sulfuric acid solution has a temperature of 150 to 220° C. at the time of cleaning. When the heating temperature is below 150° C., the oxidation performance by self-decomposition of peroxosulfuric acid cannot be sufficiently secured. On the other hand, since a too high temperature of the sulfuric acid solution causes deterioration of cleaning performance due to a too high decomposition rate of peroxosulfuric acid, the temperature is preferably 220° C. or lower.

The sulfuric acid solution to be used in the above-mentioned cleaning system preferably has a sulfuric acid concentration of 85 mass % or more. When the sulfuric acid concentration is below 85 mass %, the resist stripping performance in the cleaning apparatus is deteriorated even if the peroxosulfuric acid concentration is high. On the other hand, since the current efficiency in the electrolytic process is deteriorated at a sulfuric acid concentration exceeding 96 mass %, the concentration is preferably 96 mass % or lower.

In the cleaning apparatus, a sulfuric acid solution having a relatively high temperature is discharged after cleaning a cleaning object such as an electronic material substrate. In the present invention, a reflux line for refluxing this sulfuric acid solution to the circulation line side can be provided. The reflux line is connected to at least one of the first reservoir, the electrolytic part and the circulation line, whereby the sulfuric acid solution can be refluxed.

In the reflux line, a cooling part is preferably interposed for maintaining the liquid temperature in the first reservoir or the liquid temperature at the inlet of the electrolytic part at a predetermined temperature. Further, when the cooling part is provided in the reflux line, a decomposition part for retaining the sulfuric acid solution received from the cleaning apparatus using side and performing decomposition of a residual organic material such as a resist which is stripped from the electronic material substrate and is contained in the sulfuric acid solution can be provided on the upstream side of the cooling part. An oxidizing substance such as peroxosulfuric acid is left in the sulfuric acid solution, and the resist or the like in the sulfuric acid drainage retained in the decomposition part is oxidized, decomposed and cleared away by use of the remaining heat of the sulfuric acid solution by the effect of the oxidizing substance. This oxidation decomposition can be more effectively performed as the temperature is higher.

In the layout of the above mentioned cleaning system, the cleaning apparatus, the second reservoir and the heating part can be installed within the clean room, electrolytic part, while the first reservoir and the circulation line can be installed outside the clean room. According to this layout, the cleaning system can be efficiently arranged inside and outside of the clean room with limited space.

The present invention is suitable for use in cleaning treatment on an electronic material substrate such as a silicon wafer, a glass substrate for liquid crystal or a photomask substrate, although cleaning can be performed on various cleaning objects. More specifically, the present invention can be used for a stripping process of an organic compound such as a resist residue adhered onto a semiconductor substrate. It can be used also for a removing process of foreign matter such as fine particles, metal or the like adhered to the semiconductor substrate.

Furthermore, the present invention can be used also for a process for cleaning and stripping a contaminant adhered on a substrate such as a silicon wafer with a high-concentration sulfuric acid solution. The present invention can be desirably used as a system which does not need addition of a chemical such as hydrogen peroxide or ozone from the outside by producing a peroxosulfuric acid solution on site by an electrolytic part for enhancing the resist stripping and oxidation effects without a pretreatment such as ashing process, and using the sulfuric acid solution in a repetitive manner.

Advantageous Effects of Invention

As described so far, according to the present invention, in electrolysis of the sulfuric acid solution with circulation, the solution sending, for example, is performed in two stages such that the sulfuric acid solution is not directly sent from the first reservoir to the heating part, but is primarily sent from the first reservoir side to the second reservoir and then sent from the second reservoir to the heating part, whereby the rise of liquid pressure in the heating part can be suppressed to secure the safety.

The preheating of the sulfuric acid solution allows reduction in load of the heating part. When the heating part uses a halogen lamp, an extended life of the halogen lamp can be attained in addition to reduction in energy cost.

A part of the cleaning system is located outside and below the clean room (e.g., downstairs) as described above, whereby the cleaning system can be used even if the installation space in the clean room is limited. Since the sulfuric acid solution after rapid heating must be served for cleaning in a short period of time, it is particularly desired to install the heating part near the cleaning apparatus in the clean room.

BRIEF DESCRIPTION OF THE DRAWINGS

FIG. 1 is a flow chart showing a cleaning system in one embodiment of the present invention.

DESCRIPTION OF EMBODIMENTS

Embodiment 1

One embodiment in a functional solution supply system of the present invention will be described based on FIG. 1.

An electrolytic device 1 which corresponds to the electrolytic part of the present invention is a non-diaphragm type, in which an anode and a cathode (not shown) constituted by diamond electrodes are arranged inside without being separated from each other through a diaphragm, and a DC power source 2 is connected to both the electrodes. In the present invention, the electrolytic device can be constituted as a diaphragm type.

A first storage tank 20 which corresponds to the first reservoir of the present invention is connected to the electrolytic device 1 through a circulation line 11 so as to be capable of circulating and passing through solution. A gas-liquid separation tank 10 is interposed in the circulation line on the returning side. As the gas-liquid separation tank 10 for receiving a gas-containing sulfuric acid solution, and separating and discharging the gas in the sulfuric acid solution to the outside, a known one can be used, and the configuration thereof is not particularly limited in the present invention as long as the separation of gas and liquid can be performed.

A circulation pump 12 for circulating the sulfuric acid solution and a cooler 13 for cooling the sulfuric acid solution are interposed in the circulation line 11 on the feeding side. The cooler 13 corresponds to the first cooling part of the present invention and can preferably cool the sulfuric acid solution so that it can be electrolyzed at a liquid temperature of 40 to 80° C. The configuration of the first cooling part is not particularly limited in the present invention.

An upstream supply line 22 is connected to the first storage tank 20 through a first supply pump 21 which corresponds to the first pump of the present invention.

An electrolytic unit A is constituted by the above-mentioned electrolytic device 1, DC power source 2, circulation line 11, circulation pump 12, cooler 13, gas-liquid separation tank 10 and first storage tank 20 and a cooler 53 to be described later.

Although the gas-liquid separation tank 10 and the first storage tank 20 are separately provided in the above-mentioned system, the first storage tank may be used also as the gas-liquid separator.

A preheating tank 30 which corresponds to the second reservoir of the present invention is connected to the feeding side of the upstream supply line 22. The preheating tank 30 is provided with a preheating heater 31 that is a preheating part for heating the sulfuric acid solution stored in the preheating tank 30 to 90 to 120° C. In the present invention, the preheating part may be provided in the upstream supply line 22.

Further, a downstream supply line 32 for sending the sulfuric acid solution in the preheating tank 30 is connected to the preheating tank 30. A second supply pump 33 which corresponds to the second pump of the present invention and a rapid heating heater 34 are interposed in the downstream supply line 32, and a single-wafer cleaning apparatus 40 is connected to the feeding end side of the downstream supply line 32. The above-mentioned upstream supply line 22 and downstream supply line 32 constitute the supply line of the present invention.

The above-mentioned rapid heating heater 34 which corresponds to the heating part of the present invention has a quartz-made conduit, and rapidly heats the sulfuric acid solution in one pass manner by a near infrared heater so that a liquid temperature of 150 to 220° C. can be obtained at the inlet of the cleaning apparatus 40.

On the downstream side of the rapid heating heater 34, a liquid temperature measuring instrument 35 for measuring temperature of the sulfuric acid solution to be sent is provided in the downstream supply line 32, and the measurement result of the liquid temperature measuring instrument 35 is outputted to a current-carrying control unit 36 including the DC power source. The current-carrying control unit 36 for applying current to the second pump 33 and the rapid heating heater 34 at a predetermined energization quantity controls the energization quantity to the second pump 33 and the rapid heating heater 34. The current-carrying control unit 36 controls the energization quantity to the heater 34 based on the measurement result of the liquid temperature measuring instrument 35 so that the liquid temperature becomes a predetermined temperature. The pump flow rate of the second pump 33 controlled by the current-carrying control unit 36 is changed in output according to a request of the cleaning apparatus.

For example, if the liquid temperature is lower than the predetermined temperature, the energization quantity to the rapid heating heater 34 is increased. If the liquid temperature is higher than the predetermined temperature, the energization quantity to the rapid heating heater 34 is decreased. A controlled variable thereof is preliminarily set in association with the liquid temperature or the like, whereby the control can be performed based on the set value of the controlled variable.

The above-mentioned preheating tank 30, preheating heater 31, second pump 33, rapid heating heater 34, liquid temperature measuring instrument 35 and current-carrying control unit 36 constitute a rapid heating unit B.

The above-mentioned single-wafer cleaning apparatus 40 includes a nozzle 41 turned to an electronic material substrate 100 that is a cleaning object being carried in, and a rotary table 42 for placing and rotating the electronic material substrate 100 on which the sulfuric acid solution is sprayed or dripped little by little by the nozzle 41 as cleaning liquid. Further, the cleaning apparatus 40 includes a sulfuric acid solution recovery part 43 for recovering droplets of the sulfuric acid solution used for the cleaning, and an upstream reflux line 45 with a first reflux pump 44 interposed therein is connected to the sulfuric acid solution recovery part 43.

The above-mentioned cleaning apparatus 40, nozzle 41, rotary table 42, and sulfuric acid solution recovery part 43 constitute a cleaning unit C.

Although the single-wafer cleaning apparatus is described in this embodiment, the type of the cleaning apparatus is not limited thereto, and a cleaning apparatus of batch type or the like may be adopted.

The upstream reflux line 45 is connected to a decomposition tank 50 to temporarily store the sulfuric acid solution used for cleaning. The decomposition tank 50 corresponds to the decomposition part of the present invention. A downstream reflux line 52 is connected to the decomposition tank 50 through a second reflux pump 51, and a cooler 53 which corresponds to the second cooling part of the present invention is interposed in the downstream reflux line 52. The feeding end of the downstream reflux line 52 is connected to the first storage tank 20.

The above-mentioned upstream reflux line 45 and downstream reflux line 52 constitute the reflux line of the present invention.

The above-mentioned rapid heating unit B and cleaning unit C are installed inside a clean room 200 for treating the electronic material substrate 100 prior to cleaning, and the electrolytic unit A and the decomposition tank 50 are installed outside the clean room 200 and downstairs below the clean room 200. This allows the cleaning treatment in the clean room 20 with a limited space.

The operation of the cleaning system having the above-mentioned configuration will be then described.

In the first storage tank 20, a sulfuric acid solution having a sulfuric acid concentration of 85 to 96 mass % is stored. The sulfuric acid solution is sent by the circulation pump 12, adjusted to a suitable temperature (40 to 80° C.) for electrolysis by the cooler 13, and introduced to the inlet side of the electrolytic device 1. In the electrolytic device 1, a current is carried to between the anode and cathode by the DC power source 2 to electrolyze the sulfuric acid solution introduced to the electrolytic device 1. In the electrolytic device 1, oxidizing substance is produced on the anode side including peroxosulfuric acid oxygen in addition to gas generation, while hydrogen gas is generated on the cathode side. These oxidizing substance and gases are sent to the gas-liquid separation tank 10 through the reflux line 11 in a state where they are mixed with the sulfuric acid solution to separate the gases. The separated gases are discharged out of this system and safely treated by a catalyst device (not shown) or the like.

The sulfuric acid solution subjected to the gas separation in the gas-liquid separation tank 10, which contains peroxosulfuric acid, is further repeatedly sent to the electrolytic device 1, after returned to the first storage tank 20 through the circulation line 11, whereby the concentration of the peroxosulfuric acid is enhanced by electrolysis. When a proper concentration of peroxosulfuric acid is attained, a part of the sulfuric acid solution in the first storage tank 20 is fed to the preheating tank 30 by the first pump 21 through the upstream supply line 22. In the preheating tank 30, the sulfuric acid solution stored therein is heated to and maintained at a temperature of 90 to 120° C. by the preheating heater 31. The sulfuric acid solution in the preheating tank 30 is then fed to the cleaning apparatus 40 by the second supply pump 33 through the downstream supply line 32 and further through the rapid heating heater 34. At that time, since the preheating tank 30, the rapid heating heater 34 and the cleaning apparatus 40 are positioned above the level of the first storage tank 20, and the feeding pressure by the first supply pump 21 is relaxed in the preheating tank 30, the feeding pressure to the rapid heating heater 34 is significantly reduced. Accordingly, the second reservoir should not have a structure such that the feeding pressure of the first reservoir is transmitted to the downstream side of the second reservoir as it is.

In the rapid heating heater 34, the sulfuric acid solution contained the peroxosulfuric acid is rapidly heated by the near infrared heater while being passed through the flow passage so that it has a liquid temperature within the range of 150 to 220° C. when it is supplied to the cleaning apparatus 40. The heating temperature can be substantially equalized to the temperature in use by disposing the rapid heating heater 34 in the vicinity of the cleaning apparatus 40.

The heated sulfuric acid solution contained peroxosulfuric acid is supplied to the single-wafer cleaning apparatus 40 through the downstream supply line 32, and used for cleaning of the electronic material substrate 100. At that time, the flow rate of the sulfuric acid solution is desirably adjusted so that the solution passing time from the inlet of the rapid heating heater 34 to the use in the cleaning apparatus 40 is less than 1 minute. An appropriate flow rate in the single-wafer cleaning apparatus is 500 to 2000 mL/min, and the flow passage length and flow passage sectional area in the rapid heating heater 34 and the line length and flow passage sectional area in the downstream supply line 32 on the downstream side of the rapid heating heater 34, or the like are set so that the solution passing time is less than 1 minute at this flow rate.

In the cleaning apparatus 40, for example, the electronic material substrate 100 such as a silicon wafer provided with a resist ion-implanted at a high concentration of $1 \times 10^{15}$ atoms/$cm^2$ or more is taken as a cleaning object, and the above-mentioned sulfuric acid solution is brought into contact with the electronic material substrate 100 while rotating it on the rotary table 42, whereby the resist is efficiently stripped and removed.

The sulfuric acid solution used for cleaning is recovered by a sulfuric acid solution recovery part 43, then discharged out of the cleaning apparatus 40, and sent to and stored in the decomposition tank 50 through the upstream reflux line 45 by the first reflux pump 44. The sulfuric acid solution includes a residual organic substance such as the resist cleaned by the cleaning apparatus 40, and the residual organic substance is oxidation-decomposed by the oxidizing substance included in the sulfuric acid solution while it is stored in the decomposition tank 50. The retention time of the sulfuric acid solution in the decomposition tank 50 can be optionally adjusted depending on the content of the residual organic substance or the like. The decomposition tank 50 is configured so as to be capable of retaining heat, whereby the oxidation decomposition using the remaining heat of the sulfuric acid solution can be secured. Further, a heating device can be provided in the decomposition tank 50 as needed.

The sulfuric acid drainage in which the residual organic substance contained therein is oxidation-decomposed in the decomposition tank 50 is refluxed to the first storage tank 20 by the second reflux pump 51 through a cooler 53 interposed in the reflux line 52. A filter may be interposed on the downstream side of the decomposition tank 50 on the upstream side of the cooler 53. According to this, SS in the sulfuric acid solution which cannot be treated in the decomposition tank 50 is trapped and removed by the filter.

Since reflux of a high-temperature sulfuric acid solution to the first storage tank 20 promotes the decomposition of the peroxosulfuric acid in the sulfuric acid solution stored in the first storage tank 20, the sulfuric acid solution is introduced to the first storage tank 20 after it is cooled to a proper temperature by the cooler 53. The sulfuric acid drainage introduced into the first storage tank 20 is fed to the electrolytic device 1 as a sulfuric acid solution through the circulation line 11 to produce peroxosulfuric acid by electrolysis, and then circulated again to the first storage tank 20 through the circulation line 11.

A high temperature cleaning liquid containing peroxosulfuric acid at high concentration can be continuously supplied to the cleaning apparatus 40 that is the using side by the operation of this system.

A discharge line, which has not been described in the above, may be branched and connected to the upstream reflux line 45 on the upstream side of the decomposition tank 50 so that the sulfuric acid solution can be properly discharged to the outside without being sent to the decomposition tank 50.

The discharge line allows a control such that when the resist stripping quantity in the sulfuric acid solution used for cleaning is remarkably large just after starting of cleaning or the like, the sulfuric acid solution is discharged out of the system to reduce the load of the decomposition tank 50, and the above-mentioned sulfuric acid drainage is sent to the decomposition tank 50 in a stage where the resist stripping quantity is reduced. This control can be performed by opening/closing control of an on-off valve provided in the reflux line or the discharge line.

The present invention h as been described based on the above-mentioned embodiment. However, the scope of present invention is never limited to the content of the above-mentioned embodiment, and can be properly changed without departing from the gist of the present invention.

DESCRIPTION OF THE REFERENCE NUMERAL

1 Electrolytic device
2 DC power source
10 Gas-liquid separator
11 Circulation line
13 Cooler
20 First storage tank
21 First supply pump
22 Upstream supply line
30 Preheating tank
31 Preheating heater
32 Downstream supply line
33 Second supply pump
34 Rapid heating heater
40 Cleaning apparatus
50 Decomposition tank
A Electrolytic unit
B Rapid heating unit
C Cleaning unit

What is claimed is:

1. A cleaning system, comprising:
an electrolytic part for electrolyzing a sulfuric acid solution to produce peroxosulfuric acid;
a first reservoir for storing the electrolyzed sulfuric acid solution;
a circulation line for circulating the sulfuric acid solution between the electrolytic part and the first reservoir with the circulation line forming a closed loop extending between the electrolytic part and the first reservoir;
a cleaning apparatus for cleaning a cleaning object by use of the sulfuric acid solution containing peroxosulfuric acid;
a supply line separate and independent of the circulation line, with the supply line being connected to the first reservoir for sending the sulfuric acid solution electrolyzed in the electrolytic part from a delivery side of the first reservoir to the cleaning apparatus, with at least a part of the supply line being positioned spatially above the level of the first reservoir and the circulation line;
a heating part for heating the sulfuric acid to be used in the cleaning apparatus, the heating part being interposed in the supply line on the upstream side of the cleaning apparatus;
a second reservoir which is interposed in the supply line on the upstream side of the heating part with the second reservoir having an upstream side and a downstream side;
a first pump interposed in the supply line on the upstream side of the second reservoir; and
a second pump interposed in the supply line on the downstream side of the second reservoir;
wherein the second reservoir, the second pump and the heating part are positioned spatially above the level of the first reservoir, the electrolytic part and the circulation line such that sulfuric acid solution containing peroxosulfuric acid is supplied to the second reservoir independent of the circulation line.

2. A cleaning system according to claim 1, wherein the cleaning apparatus is positioned spatially above the level of the first reservoir, the electrolytic part and the circulation line.

3. The cleaning system according to claim 1 or 2, further comprising a preheating part for preheating the sulfuric acid solution stored in the second reservoir, the preheating part being installed inside the second reservoir or interposed in the supply line on the upstream side of the second reservoir.

4. The cleaning system according to claim 3, wherein the temperature of the sulfuric acid solution to be electrolyzed in the electrolytic part is 80° C. or lower, the temperature of the sulfuric acid solution to be heated by the preheating part and stored in the second reservoir is 90 to 120° C., and the temperature of the sulfuric acid solution to be heated by the heating part and used in the cleaning apparatus is 150 to 220° C.

5. The cleaning system according to claim 1, wherein the second pump is interposed on the upstream side of the heating part.

6. The cleaning system according to claim 1 wherein the cleaning apparatus, the second reservoir and the heating part are installed inside a clean room, and the electrolytic device and the first reservoir are installed outside and below the clean room.

7. The cleaning system according to claim 1, wherein the sulfuric acid concentration of the sulfuric acid solution is 85 mass % or more.

8. The cleaning system according to claim 1, further comprising a reflux line for refluxing the sulfuric acid solution used in the cleaning apparatus, the reflux line being connected to at least one of the first reservoir, the electrolytic part and the circulation line.

9. The cleaning system according to claim 8, comprising a decomposition part to store the sulfuric acid solution used for the cleaning is provided in the reflux line.

10. The cleaning system according to claim 1, comprising a first cooling part to cool the sulfuric acid solution feeding from the first reservoir to the electrolytic part.

11. The cleaning system according to any one of claim 9, comprising a second cooling part which is interposed in the reflux line to cool the sulfuric acid solution.

12. The cleaning system according to claim 1, wherein the cleaning apparatus is a single-wafer cleaning apparatus.

13. The cleaning system according to claim 10, comprising a second cooling part which is interposed in a reflux line to cool the sulfuric acid solution.

\* \* \* \* \*